United States Patent
Zhao et al.

(10) Patent No.: US 10,642,402 B2
(45) Date of Patent: May 5, 2020

(54) DISPLAY SUBSTRATE, DISPLAY PANEL, DISPLAY DEVICE, AND CONTROL METHOD THEREOF

(71) Applicant: BOE TECHNOLOGY GROUP CO., LTD., Beijing (CN)

(72) Inventors: Lijun Zhao, Beijing (CN); Yuzhen Guo, Beijing (CN); Haisheng Wang, Beijing (CN); Yingming Liu, Beijing (CN); Yanan Jia, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/982,079

(22) Filed: May 17, 2018

(65) Prior Publication Data

US 2019/0042044 A1    Feb. 7, 2019

(30) Foreign Application Priority Data

Aug. 7, 2017   (CN) .......................... 2017 1 0667439

(51) Int. Cl.
*G06F 3/041*     (2006.01)
*H01L 27/32*     (2006.01)
(Continued)

(52) U.S. Cl.
CPC .......... *G06F 3/0414* (2013.01); *G06F 3/0412* (2013.01); *H01L 27/323* (2013.01);
(Continued)

(58) Field of Classification Search
None
See application file for complete search history.

(56) References Cited

U.S. PATENT DOCUMENTS

2008/0036698 A1*   2/2008   Kawasaki ............. G02F 1/1368
                                                      345/55
2010/0097449 A1*   4/2010   Jeong ................. G02B 27/2214
                                                      348/59
(Continued)

FOREIGN PATENT DOCUMENTS

| CN | 105068695 A | 11/2015 |
|----|-------------|---------|
| CN | 105807991 A | 7/2016  |
| CN | 106775081 A | 5/2017  |

OTHER PUBLICATIONS

First Office Action, including Search Report, for Chinese Patent Application No. 201710667439.3, dated Jun. 14, 2019, 16 pages.

*Primary Examiner* — William Boddie
*Assistant Examiner* — Jeffrey Parker
(74) *Attorney, Agent, or Firm* — Westman, Champlin & Koehler, P.A.

(57) ABSTRACT

A display substrate includes a conductive pattern arranged on a base substrate, a plurality of pressure sensing units arranged on the base substrate, and a first pressure sensing line and a second pressure sensing line connected to the plurality of pressure sensing units and each configured to output a pressure sensing signal. At least one of the first pressure sensing line or the second pressure sensing line is within a same layer and made of a same material as the conductive pattern, or the conductive pattern is multiplexed as at least one of the first pressure sensing line or the second pressure sensing line.

19 Claims, 4 Drawing Sheets

(51) Int. Cl.
*H01L 51/52* (2006.01)
*H01L 51/00* (2006.01)

(52) U.S. Cl.
CPC ...... *H01L 27/3276* (2013.01); *H01L 51/5206* (2013.01); *H01L 51/5234* (2013.01); *H01L 27/3225* (2013.01); *H01L 51/0097* (2013.01)

(56) References Cited

U.S. PATENT DOCUMENTS

| | | | | |
|---|---|---|---|---|
| 2011/0063239 | A1* | 3/2011 | Xie | G06F 3/045 345/173 |
| 2016/0320882 | A1* | 11/2016 | Kim | G06F 3/044 |
| 2017/0062153 | A1* | 3/2017 | Ben Abdelaziz | H01H 9/181 |
| 2017/0221971 | A1 | 8/2017 | Shen et al. | |
| 2017/0235414 | A1 | 8/2017 | Ding et al. | |
| 2018/0107322 | A1 | 4/2018 | Liu et al. | |

\* cited by examiner

DISPLAY SUBSTRATE, DISPLAY PANEL, DISPLAY DEVICE, AND CONTROL METHOD THEREOF

CROSS-REFERENCE TO RELATED APPLICATION

The present application claims a priority of the Chinese patent application No. 201710667439.3 filed on Aug. 7, 2017, which is incorporated herein by reference in its entirety.

TECHNICAL FIELD

The present disclosure relates to the field of display technology, in particular to a display substrate, a display panel, a display device and a control method thereof.

BACKGROUND

Along with the rapid development of the display technology, the semiconductor technology of using an organic light-emitting diode (OLED) as a core of a display device has made great development. For a conventional display device, due to such advantages as self-luminescence, rapid response, wide viewing angle and being capable of formed on a flexible substrate, the OLED as a current-mode light-emitting element has been widely used for high-performance display.

Pressure sensing function is an important function in the display sensing field, and a pressure sensor is integrated into an OLED display device, so as to achieve a sensing function and a display function simultaneously. Usually, the pressure sensor and the OLED display device are manufactured separately, and then the pressure sensor is attached onto a back plate of the OLED display device. In addition, in order to improve the sensitivity of the pressure sensor, a spacer is arranged between the back plate of the OLED display device and the pressure sensor. Hence, the OLED display device integrated with the pressure sensor has a relatively large thickness as well as a relatively complex structure.

SUMMARY

In one aspect, the present disclosure provides in some embodiments a display substrate, including a base substrate; a conductive pattern arranged on the base substrate; a plurality of pressure sensing units arranged on the base substrate; and a first pressure sensing line and a second pressure sensing line connected to the plurality of pressure sensing units and configured to output a pressure sensing signal, wherein at least one of the first pressure sensing line or the second pressure sensing line is within a same layer and made of a same material as the conductive pattern, or the conductive pattern is multiplexed as at least one of the first pressure sensing line or the second pressure sensing line.

In a possible embodiment of the present disclosure, the pressure sensing unit includes a first pressure sensing electrode connected to the first pressure sensing line, a second pressure sensing electrode connected to the second pressure sensing line, and a piezoelectric layer arranged between the first pressure sensing electrode and the second pressure sensing electrode.

In a possible embodiment of the present disclosure, the display substrate is an OLED display substrate, and the conductive pattern includes a plurality of cathodes arranged independent of each other and multiplexed as the first pressure sensing line.

In a possible embodiment of the present disclosure, the second pressure sensing line is formed separately, and the first pressure sensing electrode and the first pressure sensing line are formed integrally or through different processes.

In a possible embodiment of the present disclosure, the display substrate is an OLED display substrate, the conductive pattern includes a plurality of cathodes and a plurality of anodes arranged independent of each other, the cathode is multiplexed as the second pressure sensing line, and the first pressure sensing line is within a same layer and made of a same material as the anode, and arranged independent of the anode.

In a possible embodiment of the present disclosure, the first pressure sensing electrode and the first pressure sensing line are formed integrally or through different processes, and the second pressure sensing electrode and the second pressure sensing line are formed integrally or through different processes.

In a possible embodiment of the present disclosure, the display substrate is an OLED display substrate, the conductive pattern includes a cathode and an anode of the OLED display substrate, the first pressure sensing line is within a same layer and made of a same material as the anode, and arranged independent of the anode, and the second pressure sensing line is within a same layer and made of a same material as the anode, and arranged independent of the anode.

In a possible embodiment of the present disclosure, the first pressure sensing electrode and the first pressure sensing line are formed integrally or through different processes, and the second pressure sensing electrode and the second pressure sensing line are formed integrally or through different processes.

In a possible embodiment of the present disclosure, the display substrate is an OLED display substrate, the conductive pattern includes a data line and an anode of the OLED display substrate, the data line of the OLED display substrate is multiplexed as the first pressure sensing line, and the second pressure sensing line is within a same layer and made of a same material as the anode, and arranged independent of the anode.

In a possible embodiment of the present disclosure, the second pressure sensing electrode and the second pressure sensing line are formed integrally or through different processes.

In a possible embodiment of the present disclosure, the display substrate is an OLED display substrate, the conductive pattern includes a data line and an electrode of a storage capacitor of the OLED display substrate, the electrode of the storage capacitor is multiplexed as the first pressure sensing line, and the data line of the OLED display substrate is multiplexed as the second pressure sensing line.

In a possible embodiment of the present disclosure, the display substrate is an OLED display substrate, the conductive pattern includes a first electrode and a second electrode of a storage capacitor of the OLED display substrate, the first electrode is multiplexed as the first pressure sensing line, and the second electrode is multiplexed as the second pressure sensing line.

In a possible embodiment of the present disclosure, the base substrate is a flexible substrate.

In a possible embodiment of the present disclosure, the piezoelectric layer is made of plumbum-based lanthanum-doped zirconate titanate (PZT), and the first pressure sensing electrode and the second pressure sensing electrode are both made of 3,4-ethylenedioxythiophene monomer.

In a possible embodiment of the present disclosure, when the display substrate is an array substrate of a liquid crystal display panel, the conductive pattern includes a pixel electrode, a common electrode and a data line, and when the display substrate is an OLED display substrate, the conductive pattern includes an anode, a cathode, a first electrode and a second electrode of a storage capacitor, and a data line of the OLED display substrate.

In another aspect, the present disclosure provides in some embodiments a display panel including the above-mentioned display substrate.

In yet another aspect, the present disclosure provides in some embodiments a display device including the above-mentioned display panel.

In still yet another aspect, the present disclosure provides in some embodiments a method for controlling the above-mentioned display device, including a step of, a conductive pattern of a display substrate is multiplexed as at least one of a first pressure sensing line or a second pressure sensing line, within a display time period of each frame, applying a common voltage signal to a cathode or a common electrode of the display substrate and applying a data voltage signal to an anode or a pixel electrode of the display substrate, and within a pressure detection time period of each frame, detecting a pressure sensing signal on each of the first pressure sensing line and the second pressure sensing line.

In a possible embodiment of the present disclosure, the display substrate is an organic light-emitting diode (OLED) display substrate and the conductive pattern is a cathode, the method includes: within the display time period of each frame, applying the common voltage signal to a cathode of an OLED display substrate; and within the pressure detection time period of each frame, detecting the pressure sensing signal on the cathode of the OLED display substrate.

In a possible embodiment of the present disclosure, the display substrate is an OLED display substrate and the conductive pattern is a data line, the method includes: within the display time period of each frame, applying the data voltage signal to a data line of the OLED display substrate; and within the pressure detection time period of each frame, detecting the pressure sensing signal on the data line of the OLED display substrate.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments.

Figure 1:
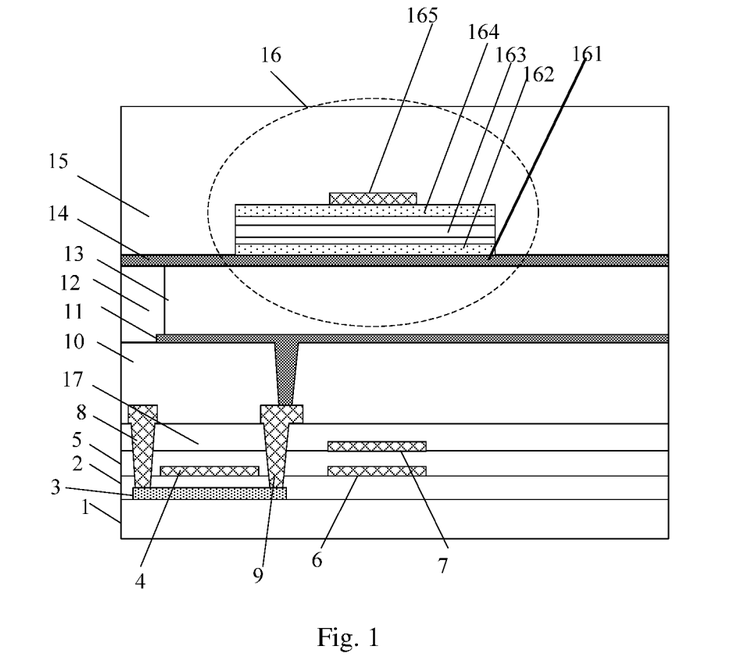
FIG. 1 is a schematic view showing an OLED display substrate according to one embodiment of the present disclosure.

The present disclosure provides in some embodiments an OLED display substrate which, as shown in FIG. 1, includes a thin film transistor (TFT), a light-emitting element, a storage capacitor, a data line and an intermediate insulation layer 17 arranged on a base substrate 1. The TFT includes an active layer 3 arranged on the base substrate 1, a first gate insulation layer 2 covering the active layer 3, a gate electrode 4 arrange on the first gate insulation layer 2, a second gate insulation layer 5 covering the gate electrode 4, and a source electrode 8 and a drain electrode 9 arranged on the intermediate insulation layer 17. The light-emitting element includes an anode 11, a cathode 14, and an organic function layer 13 arranged between the anode 11 and the cathode 14. The anode 11 is connected to the drain electrode 9 through a via-hole in a planarization layer 10, and the source electrode 8 is connected to the data line. The storage capacitor includes a first electrode 6 arranged on the second gate insulation layer 5 and a second electrode 7 arranged on the intermediate insulation layer 17. A thin film package layer 15 further covers the OLED display substrate. The display substrate further includes a plurality of pressure sensing units arranged on the base substrate, and a first pressure sensing line and a second pressure sensing line connected to the plurality of pressure sensing units and each configured to output a pressure sensing signal. At least one of the first pressure sensing line or the second pressure sensing line is created from a layer same as the conductive pattern, or the conductive pattern is multiplexed as at least one of the first pressure sensing line or the second pressure sensing line. In this way, it is able to embed the pressure sensing units, the first pressure sensing line and the second pressure sensing line into the display substrate, so it is unnecessary to attach the pressure sensing unit onto the display panel. As a result, it is able to provide the display substrate integrated with a pressure sensing function, simplify a structure of the display substrate, reduce a thickness of the display substrate, and provide the light and thin display device.

The display substrate may be an array substrate of a liquid crystal display panel, or an OLED display substrate. When the display substrate is the array substrate, the conductive pattern may include a pixel electrode, a common electrode and a data line. When the display substrate is the OLED display substrate, the conductive pattern may include electrodes and signal lines of the OLED display substrate, e.g., an anode, a cathode, a first electrode and a second electrode of a storage capacitor, and a data line.

As shown in FIGS. 1 to 6, each pressure sensing unit 16 includes a first pressure sensing electrode 162 connected to the first pressure sensing line 161, a second pressure sensing electrode 164 connected to the second pressure sensing line 165, and a piezoelectric layer 163 arranged between the first pressure sensing electrode 162 and the second pressure sensing electrode 164.

When a pressure is applied onto the piezoelectric layer 163, positive and negative induced charges may be generated on the first pressure sensing electrode 162 and the second pressure sensing electrode 164 in contact with the piezoelectric layer 163 respectively. At this time, it is able to detect electric signals on the first pressure sensing line 161 and the second pressure sensing line 165, thereby to detect the pressure.

To be specific, the base substrate 1 is a flexible substrate made of, e.g., polyimide (PI), i.e., the OLED display substrate is a flexible OLED display substrate. When being pressured, the OLED display substrate is capable of being deformed. The larger the deformation level of the OLED display substrate is, the more the charges generated by the piezoelectric layer 163 are. In this way, it is able to detect the pressure in a better manner.

The piezoelectric layer 163 of the pressure sensing unit 16 may be made of PZT. The flexible OLED display substrate has a relatively low tolerable temperature (<80° C.), so when integrating the pressure sensing unit 16 thereinto, a manufacture process may be limited greatly. The PZT may be applied through a printing process, so it is able to reduce the requirement on the manufacture process.

Each of the first pressure sensing electrode 162 and the second pressure sensing electrode 164 may be made of a transparent conductive material, e.g., indium tin oxide (ITO), indium zinc oxide (IZO), or 3,4-ethylenedioxythiophene monomer.

In a possible embodiment of the present disclosure, as shown in FIG. 1, the cathode 14 of the OLED display substrate may be patterned, i.e., the OLED display substrate may include a plurality of cathodes 14 arranged independent of each other. Each cathode 14 of the OLED display substrate may be multiplexed as the first pressure sensing line 161, and the first pressure sensing electrode 162, the piezoelectric layer 163 and the second pressure sensing electrode 164 of each pressure sensing unit 16 as well as the second pressure sensing line 165 may be arranged sequentially on the cathode 14. The second pressure sensing line 165 may be formed separately. The first pressure sensing electrode 162 and the first pressure sensing line 161 may be formed integrally or through different manufacture processes.

Because the cathode 14 of the OLED display substrate is multiplexed as the first pressure sensing line 161, it is necessary to multiplex the cathode 14 in a time-division manner during the operation of the OLED display substrate. To be specific, within a display time period of each frame, a common voltage signal may be applied to the cathode 14 of the OLED display substrate, and a data voltage signal may be applied to the anode 11 of the OLED display substrate. Within a pressure detection time period of each frame, a pressure sensing signal on the cathode 14 and the second pressure sensing line 165 of the OLED display substrate may be detected.

Figure 2:
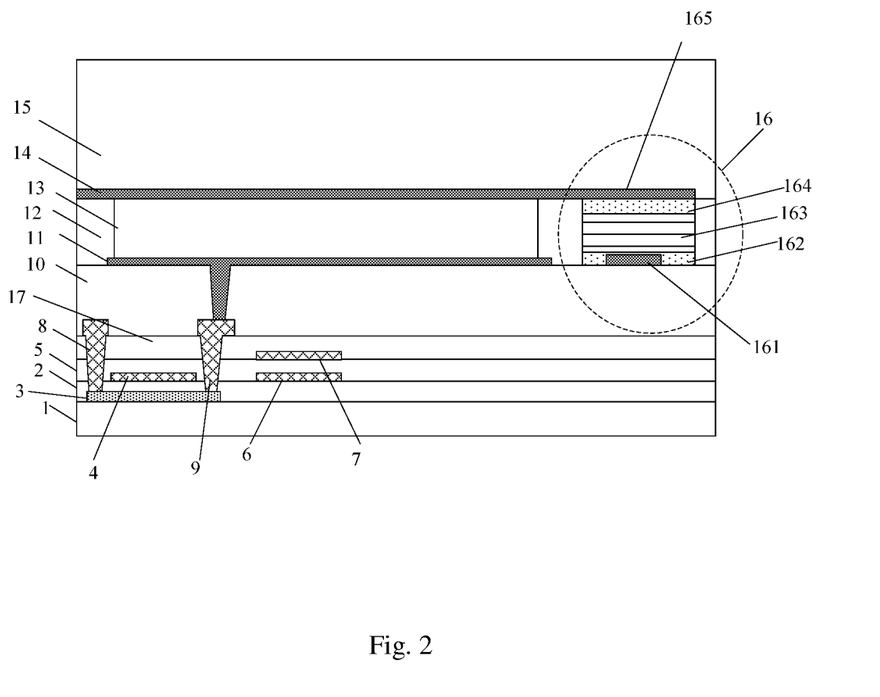
FIG. 2 is another schematic view showing the OLED display substrate according to one embodiment of the present disclosure.

In a possible embodiment of the present disclosure, as shown in FIG. 2, the cathode 14 of the OLED display substrate may be patterned, i.e., the OLED display substrate may include a plurality of cathodes 14 arranged independent of each other. Each cathode 14 of the OLED display substrate may be multiplexed as the second pressure sensing line 162, and the first pressure sensing line 161 and the first pressure sensing electrode 162, the piezoelectric layer 163 and the second pressure sensing electrode 164 of the pressure sensing unit 16 may be further arranged sequentially on the OLED display substrate. The first pressure sensing line 161 may be created from a layer same as, and not electrically connected to (i.e., arranged independent of), the anode 11 of the OLED display substrate. In this way, it is able to form the first pressure sensing line 161 and the anode 11 of the OLED display substrate through a single patterning process, thereby to simplify the manufacture of the OLED display substrate and reduce the manufacture cost thereof. The first pressure sensing electrode 162 and the first pressure sensing line 161 may be formed integrally or through different processes, and the second pressure sensing electrode 164 and the second pressure sensing line 165 may be formed integrally or through different processes.

Because the cathode 14 of the OLED display substrate is multiplexed as the second pressure sensing line 165, it is necessary to multiplex the cathode 14 in a time-division manner during the operation of the OLED display substrate. To be specific, within the display time period of each frame, the common voltage signal may be applied to the cathode 14 of the OLED display substrate, and the data voltage signal may be applied to the anode 11 of the OLED display substrate. Within the pressure detection time period of each frame, the pressure sensing signal on the cathode 14 and the first pressure sensing line 161 of the OLED display substrate may be detected.

Figure 3:
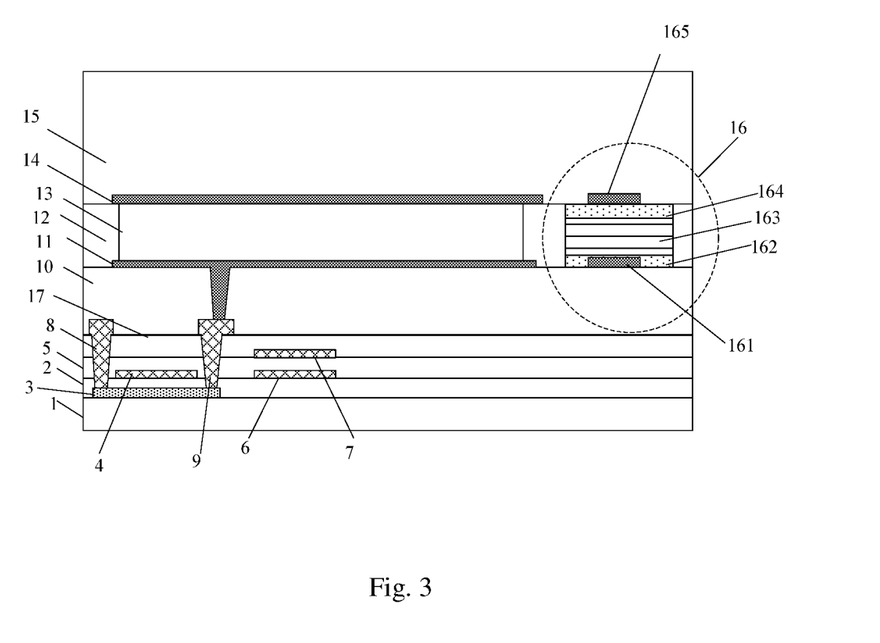
FIG. 3 is yet another schematic view showing the OLED display substrate according to one embodiment of the present disclosure.

In a possible embodiment of the present disclosure, as shown in FIG. 3, the first pressure sensing line 161 may be created from a layer same as, and not electrically connected to (i.e., arranged independent of), the anode 11 of the OLED display substrate. The second pressure sensing line 165 may be created from a layer same as, and not electrically connected to (i.e., arranged independent of), the cathode 14 of the OLED display substrate. In this way, it is able to form the first pressure sensing line 161 and the anode 11 of the OLED display substrate through a single patterning process, and form the second pressure sensing line 165 and the cathode 14 of the OLED display substrate through a single patterning process, thereby to simplify the manufacture of the OLED display substrate and reduce the manufacture cost thereof. The first pressure sensing electrode 162 and the first pressure sensing line 161 may be formed integrally or through different processes, and the second pressure sensing electrode 164 and the second pressure sensing line 165 may be formed integrally or through different processes.

Because electrode of the OLED display substrate is not multiplexed as the pressure sensing line, it is unnecessary to multiplex the electrode in a time-division manner during the operation of the OLED display substrate. To be specific, within the display time period of each frame, the common voltage signal may be applied to the cathode 14 of the OLED display substrate, and a data voltage signal may be applied to the anode 11 of the OLED display substrate. Within the pressure detection time period of each frame, the pressure sensing signal on the first pressure sensing line 161 and the second pressure sensing line 165 of the OLED display substrate may be detected.

Figure 4:
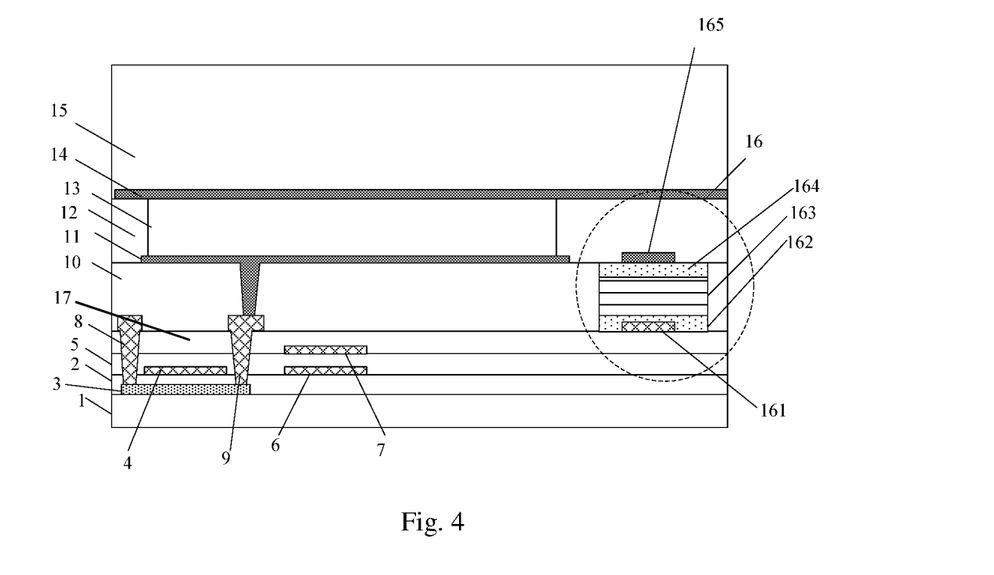
FIG. 4 is still yet another schematic view showing the OLED display substrate according to one embodiment of the present disclosure.
Figure 5:
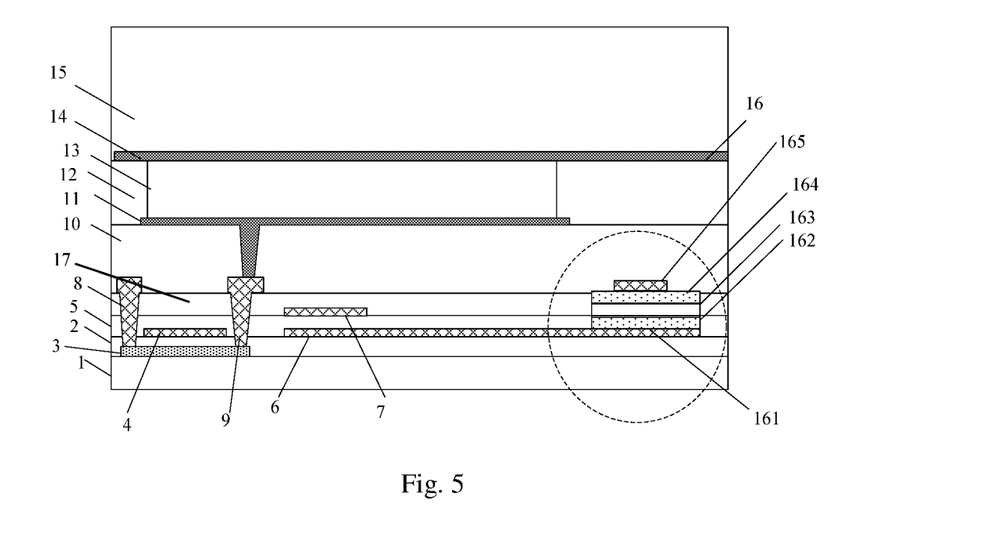
FIG. 5 is still yet another schematic view showing the OLED display substrate according to one embodiment of the present disclosure.

In a possible embodiment of the present disclosure, as shown in FIG. 4, the second pressure sensing line 165 may be created from a layer same as, and not electrically connected to (i.e., arranged independent of), the anode 11 of the OLED display substrate. In this way, it is able to form the second pressure sensing line 165 and the anode 11 of the OLED display substrate through a single patterning process, thereby to simplify the manufacture of the OLED display substrate and reduce the manufacture cost thereof. In addition, a data line of the OLED display substrate may be multiplexed as the first pressure sensing line 161. The second pressure sensing electrode 164 and the second pressure sensing line 165 may be formed integrally or through different processes.

Because the data line of the OLED display substrate is multiplexed as the pressure sensing line, it is necessary to multiplex the data line in a time-division manner during the operation of the OLED display substrate. To be specific, within the display time period of each frame, a data voltage signal may be applied to the data line of the OLED display substrate. Within the pressure detection time period of each frame, the pressure sensing signal on the data line and the second pressure sensing line 165 of the OLED display substrate may be detected.

Figure 6:
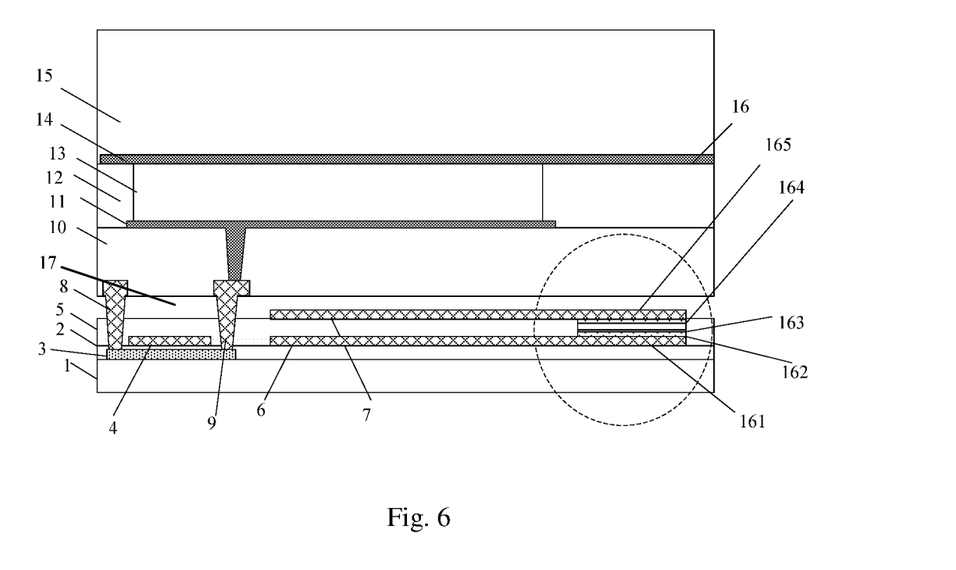
FIG. 6 is still yet another schematic view showing the OLED display substrate according to one embodiment of the present disclosure.

Further, as shown in FIG. 6, one electrode of the storage capacitor of the OLED display substrate may be multiplexed as the first pressure sensing line 161, and the data line of the OLED display substrate may be multiplexed as the second pressure sensing line 165. In this way, it is necessary to multiplex the data line during the operation of the OLED display substrate. To be specific, within the display time period of each frame, the data voltage signal may be applied to the data line of the OLED display substrate, and within the pressure detection time period of each frame, the pressure sensing signal on the second pressure sensing line 165 and the data line of the OLED display substrate may be detected.

Further, as shown in FIG. 6, the first electrode 6 of the storage capacitor of the OLED display substrate may be multiplexed as the first pressure sensing line 161, and the second electrode 7 of the storage capacitor may be multiplexed as the second pressure sensing line 165. In this way, it is necessary to multiplex the electrodes of the storage capacitor in a time-division manner during the operation of the OLED display substrate. To be specific, within the display time period of each frame, the storage capacitor may function as to maintain a potential, and within the pressure detection time period of each frame, the pressure sensing signal on the first pressures sensing line 161 and the second pressure sensing line 165 of the OLED display substrate may be detected.

The present disclosure further provides in some embodiments a display panel including the above-mentioned display substrate. If the display substrate is an OLED display substrate, as shown in FIGS. 1 to 6, the display panel may further include a thin film package layer 15 covering the OLED display substrate.

The present disclosure further provides in some embodiments a display device including the above-mentioned display panel. The display device may be any product or member having a display function, e.g., television, display, digital photo frame, mobile phone or flat-panel computer. The display device may further include a flexible circuit board, a printed circuit board and a back plate.

The present disclosure further provides in some embodiments a method for controlling the above-mentioned display device, including a step of, when the conductive pattern of the display substrate is multiplexed as at least one of the first pressure sensing line 161 or the second pressure sensing line 165, within the display time period of each frame, applying the common voltage signal to the cathode 14 or the common electrode of the display substrate and applying the data voltage signal to the anode 11 or the pixel electrode of the display substrate, and within the pressure detection time period of each frame, detecting the pressure sensing signal on each of the first pressure sensing line 161 and the second pressure sensing line 165.

In the embodiments of the present disclosure, when the conductive pattern of the display substrate is multiplexed as at least one of the first pressure sensing line 161 or the second pressure sensing line 165, it is necessary to multiplex the conductive pattern in a time-division manner.

When the display substrate is an array substrate of a liquid crystal display panel, within the display time period of each frame, the common voltage signal may be applied to the common electrode of the display substrate, and the data voltage signal may be applied to the pixel electrode of the display substrate. Within the pressure detection time period of each frame, the pressure sensing signal on the first pressure sensing line and the second pressure sensing line may be detected.

When the display substrate is an OLED display substrate, within the display time period of each frame, the common voltage signal may be applied to the cathode of the OLED display substrate, and the data voltage signal may be applied to the anode of the OLED display substrate. Within the pressure detection time period of each frame, the pressure sensing signal on the first pressure sensing line and the second pressure sensing line may be detected.

Further, when the cathode 14 is multiplexed as the first pressure sensing line 161, the method includes: within the display time period of each frame, applying the common voltage signal to the cathode 14 of the OLED display substrate; and within the pressure detection time period of each frame, detecting the pressure sensing signal on the cathode 14 of the OLED display substrate.

Further, when the data line of the OLED display substrate is multiplexed as the first pressure sensing line 161, the method includes: within the display time period of each frame, applying the data voltage signal to the data line of the OLED display substrate; and within the pressure detection time period of each frame, detecting the pressure sensing signal on the data line of the OLED display substrate.

Of course, the method in the embodiments of the present disclosure may not be limited to those mentioned above. When any signal line or electrode of the display substrate is multiplexed as the pressure sensing line of the pressure sensing unit, it is necessary to multiplex the signal line or electrode during the operation of the display substrate. To be specific, each frame includes the display time period and the pressure detection time period. Within the display time period, a display signal, e.g., the common voltage signal or the data voltage signal, is applied to the multiplexed signal line or electrode, and within the pressure detection time period, the pressure sensing signal on the multiplexed signal line or electrode is detected.

When the signal line or electrode of the display substrate is not multiplexed as, but created from a layer same as and arranged independent of, the pressure sensing line of the pressure sensing unit, it is unnecessary to multiple the signal line or electrode any more. To be specific, within the display time period of each frame, the display signal, e.g., the common voltage signal or the data voltage signal, is applied to the signal line or electrode, and within the pressure detection time period, the pressure sensing signal on the pressure sensing line of the pressure sensing unit is detected.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, when such an element as layer, film, region or substrate is arranged "on" or "under"

another element, it may be directly arranged "on" or "under" the other substrate, or an intermediate element may be arranged therebetween.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising:
a base substrate;
a conductive pattern arranged on the base substrate;
a plurality of pressure sensing units arranged on the base substrate; and
a first pressure sensing line and a second pressure sensing line connected to the plurality of pressure sensing units and configured to output a pressure sensing signal,
wherein at least one of the first pressure sensing line or the second pressure sensing line is within a same layer and made of a same material as the conductive pattern, or the conductive pattern is multiplexed as at least one of the first pressure sensing line or the second pressure sensing line,
the display substrate is an OLED display substrate, the conductive pattern comprises a data line and an anode of the OLED display substrate, the data line of the OLED display substrate is multiplexed as the first pressure sensing line, and the second pressure sensing line is within a same layer and made of a same material as the anode, and arranged independent of the anode.

2. The display substrate according to claim 1, wherein the pressure sensing unit comprises a first pressure sensing electrode connected to the first pressure sensing line, a second pressure sensing electrode connected to the second pressure sensing line, and a piezoelectric layer arranged between the first pressure sensing electrode and the second pressure sensing electrode.

3. The display substrate according to claim 2, wherein the display substrate is an organic light-emitting diode (OLED) display substrate, and the conductive pattern comprises a plurality of cathodes arranged independent of each other and multiplexed as the first pressure sensing line.

4. The display substrate according to claim 3, wherein the second pressure sensing line is formed separately, and the first pressure sensing electrode and the first pressure sensing line are formed integrally or through different processes.

5. The display substrate according to claim 2, wherein the display substrate is an OLED display substrate, the conductive pattern comprises a plurality of cathodes and a plurality of anodes arranged independent of each other, the cathode is multiplexed as the second pressure sensing line, and the first pressure sensing line is within a same layer and made of a same material as the anode, and arranged independent of the anode.

6. The display substrate according to claim 5, wherein the first pressure sensing electrode and the first pressure sensing line are formed integrally or through different processes, and the second pressure sensing electrode and the second pressure sensing line are formed integrally or through different processes.

7. The display substrate according to claim 2, wherein the display substrate is an OLED display substrate, the conductive pattern comprises a cathode and an anode of the OLED display substrate, the first pressure sensing line is within a same layer and made of a same material as the anode, and arranged independent of the anode, and the second pressure sensing line is within a same layer and made of a same material as the anode, and arranged independent of the anode.

8. The display substrate according to claim 7, wherein the first pressure sensing electrode and the first pressure sensing line are formed integrally or through different processes, and the second pressure sensing electrode and the second pressure sensing line are formed integrally or through different processes.

9. The display substrate according to claim 1, wherein the second pressure sensing electrode and the second pressure sensing line are formed integrally or through different processes.

10. A display substrate, comprising:
a base substrate;
a conductive pattern arranged on the base substrate;
a plurality of pressure sensing units arranged on the base substrate; and
a first pressure sensing line and a second pressure sensing line connected to the plurality of pressure sensing units and configured to output a pressure sensing signal,
wherein at least one of the first pressure sensing line or the second pressure sensing line is within a same layer and made of a same material as the conductive pattern, or the conductive pattern is multiplexed as at least one of the first pressure sensing line or the second pressure sensing line,
wherein the display substrate is an OLED display substrate, the conductive pattern comprises a data line and an electrode of a storage capacitor of the OLED display substrate, the electrode of the storage capacitor is multiplexed as the first pressure sensing line, and the data line of the OLED display substrate is multiplexed as the second pressure sensing line.

11. A display substrate, comprising:
a base substrate;
a conductive pattern arranged on the base substrate;
a plurality of pressure sensing units arranged on the lyase substrate; and
a first pressure sensing line and a second pressure sensing line connected to the plurality of pressure sensing units and configured to output a pressure sensing signal,
wherein at least one of the first pressure sensing line or the second pressure sensing line is within a same layer and made of a same material as the conductive pattern, or the conductive pattern is multiplexed as at least one of the first pressure sensing line or the second pressure sensing line,
wherein the display substrate is an OLED display substrate, the conductive pattern comprises a first electrode and a second electrode of a storage capacitor of the OLED display substrate, the first electrode is multiplexed as the first pressure sensing line, and the second electrode is multiplexed as the second pressure sensing line.

12. The display substrate according to claim 1, wherein the base substrate is a flexible substrate.

13. The display substrate according to claim 2, wherein the piezoelectric layer is made of plumbum-based lanthanum-doped zirconate titanate (PZT), and the first pressure sensing electrode and the second pressure sensing electrode are both made of 3,4-ethylenedioxythiophene monomer.

14. The display substrate according to claim 1, wherein when the display substrate is an array substrate of a liquid crystal display panel, the conductive pattern comprises a pixel electrode, a common electrode and a data line, and when the display substrate is an OLED display substrate, the conductive pattern comprises an anode, a cathode, a first electrode and a second electrode of a storage capacitor, and a data line of the OLED display substrate.

15. A display panel comprising the display substrate according to claim 1.

16. A display device comprising the display panel according to claim 15.

17. A method for controlling the display device according to claim 16, comprising a step of, a conductive pattern of a display substrate is multiplexed as at least one of a first pressure sensing line or a second pressure sensing line, within a display time period of each frame, applying a common voltage signal to a cathode or a common electrode of the display substrate and applying a data voltage signal to an anode or a pixel electrode of the display substrate, and within a pressure detection time period of each frame, detecting a pressure sensing signal on each of the first pressure sensing line and the second pressure sensing line.

18. The method according to claim 17, wherein the display substrate is an organic light-emitting diode (OLED) display substrate and the conductive pattern is a cathode, the method comprises:
within the display time period of each frame, applying the common voltage signal to the cathode of the OLED display substrate; and
within the pressure detection time period of each frame, detecting the pressure sensing signal on the cathode of the OLED display substrate.

19. The method according to claim 17, wherein the display substrate is an OLED display substrate and the conductive pattern is a data line, the method comprises:
within the display time period of each frame, applying the data voltage signal to the data line of the OLED display substrate; and
within the pressure detection time period of each frame, detecting the pressure sensing signal on the data line of the OLED display substrate.

\* \* \* \* \*